United States Patent [19]

Hwang et al.

[11] Patent Number: 5,174,856
[45] Date of Patent: Dec. 29, 1992

[54] METHOD FOR REMOVAL OF PHOTORESIST OVER METAL WHICH ALSO REMOVES OR INACTIVATES CORROSION-FORMING MATERIALS REMAINING FROM PREVIOUS METAL ETCH

[75] Inventors: Jeng H. Hwang, Cupertino; Steve Y. Mak, Pleasanton, both of Calif.

[73] Assignee: Applied Materials, Inc., Santa Clara, Calif.

[21] Appl. No.: 749,733

[22] Filed: Aug. 26, 1991

[51] Int. Cl.⁵ .................... B44C 1/22; B29C 37/00
[52] U.S. Cl. ........................ 156/643; 134/1; 156/651; 156/655; 156/668
[58] Field of Search .............. 156/643, 646, 651, 655, 156/657, 659.1, 662, 668, 345; 204/192.36, 298.33; 134/1, 19, 31

[56] References Cited

U.S. PATENT DOCUMENTS 4,980,022  12/1990  Fujimura et al. ............... 134/1 X
5,057,187  10/1991  Shinagawa et al. ............. 156/643

FOREIGN PATENT DOCUMENTS 63-216346  9/1988  Japan ............................ 156/643
2-140923   5/1990  Japan ............................ 156/643

OTHER PUBLICATIONS

Toy, David A., "Choose the Right Process to Strip Your Photoresist", *Semiconductor International*, Feb., 1990, pp. 82-87.

*Primary Examiner*—William A. Powell
*Attorney, Agent, or Firm*—John P. Taylor

[57] ABSTRACT

A process is described for removing from an integrated circuit structure photoresist remaining after a metal etch which also removes or inactivates a sufficient amount of any remaining chlorine residues remaining from the previous metal etch to inhibit corrosion of the remaining metal for at least 24 hours. The process includes a first stripping step using either $O_2$ gas or a combination of $O_2$ gas and $N_2$ gas and/or a fluorocarbon gas associated with a plasma followed by a subsequent step using a combination of $O_2$ and $NH_3$ gases associated with a plasma. When fluorocarbon gas is used in the first stripping step, a flushing step may be used prior to introduction of the $NH_3$ gas to flush out any remaining fluorocarbon gas. Preferably, the plasma is generated in a microwave plasma generator located upstream of the stripping chamber and the stripping gases pass through this generator so that reactive species produced from the gases in the plasma enter the stripping chamber.

20 Claims, 1 Drawing Sheet

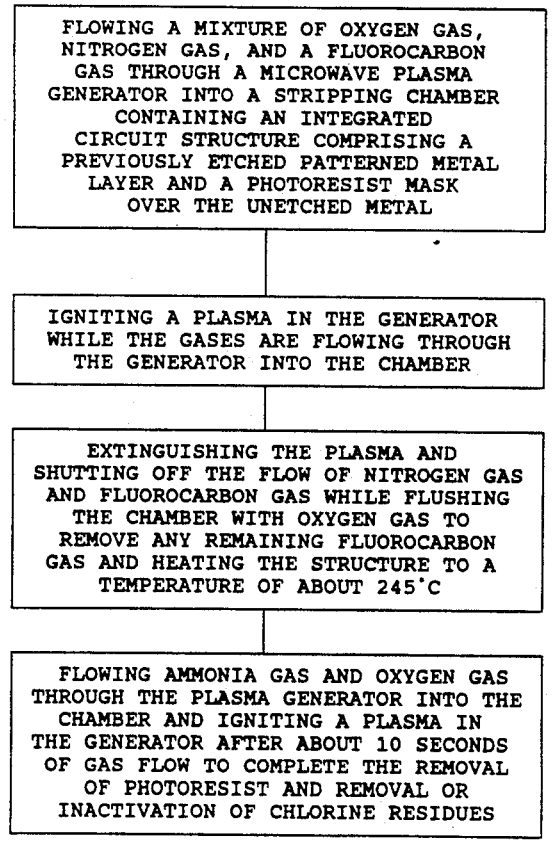

```
┌─────────────────────────────────────┐
│     FLOWING A MIXTURE OF OXYGEN GAS,│
│   NITROGEN GAS, AND A FLUOROCARBON  │
│      GAS THROUGH A MICROWAVE PLASMA │
│    GENERATOR INTO A STRIPPING CHAMBER│
│        CONTAINING AN INTEGRATED     │
│        CIRCUIT STRUCTURE COMPRISING A│
│    PREVIOUSLY ETCHED PATTERNED METAL│
│       LAYER AND A PHOTORESIST MASK  │
│           OVER THE UNETCHED METAL   │
└─────────────────────────────────────┘
                    │
┌─────────────────────────────────────┐
│    IGNITING A PLASMA IN THE GENERATOR│
│    WHILE THE GASES ARE FLOWING THROUGH│
│       THE GENERATOR INTO THE CHAMBER │
└─────────────────────────────────────┘
                    │
┌─────────────────────────────────────┐
│        EXTINGUISHING THE PLASMA AND │
│   SHUTTING OFF THE FLOW OF NITROGEN GAS│
│    AND FLUOROCARBON GAS WHILE FLUSHING│
│       THE CHAMBER WITH OXYGEN GAS TO │
│       REMOVE ANY REMAINING FLUOROCARBON│
│      GAS AND HEATING THE STRUCTURE TO A│
│         TEMPERATURE OF ABOUT 245°C   │
└─────────────────────────────────────┘
                    │
┌─────────────────────────────────────┐
│     FLOWING AMMONIA GAS AND OXYGEN GAS│
│    THROUGH THE PLASMA GENERATOR INTO THE│
│       CHAMBER AND IGNITING A PLASMA IN│
│    THE GENERATOR AFTER ABOUT 10 SECONDS│
│     OF GAS FLOW TO COMPLETE THE REMOVAL│
│          OF PHOTORESIST AND REMOVAL OR│
│      INACTIVATION OF CHLORINE RESIDUES│
└─────────────────────────────────────┘
```

METHOD FOR REMOVAL OF PHOTORESIST OVER METAL WHICH ALSO REMOVES OR INACTIVATES CORROSION-FORMING MATERIALS REMAINING FROM PREVIOUS METAL ETCH

BACKGROUND OF THE INVENTION

1. Field of the Invention

This invention relates to a process for removing photoresist remaining over a metal layer after etching of the metal layer. More particularly, this invention relates to a dry process for removing photoresist and also removing or inactivating corrosion-forming etch residues remaining over a metal layer after etching of the metal layer.

2. Description of the Related Art

A photoresist mask, which remains over portions of one or more metal layers on an integrated circuit structure after patterning such metal layers through the photoresist mask, has been conventionally removed by dry etch techniques using plasmas of oxygen and fluorocarbon gases. Such dry etch techniques are preferred over wet etch techniques since the underlying metals are not attacked, and because the dry etching is sometimes more effective in removal of photoresist residues, particularly when the photoresist has been altered by reactive ion etching, high temperature post bakes, or the like.

However, such dry etch techniques have been found to be less than satisfactory in removing or inactivating certain sidewall etch residues remaining from the previous metal etch (patterning) step. Such metal etch processes conventionally use chlorine-based chemistry, e.g., $Cl_2$ and $BCl_3$, which may leave chlorine-containing residues on/in sidewalls of the photoresist mask and underlying metal layer portions after the metal etch.

If such chlorine-containing residues (regardless of their source) in the sidewall residues, remaining after the metal etch step, are not removed or inactivated during the subsequent removal of the photoresist mask, such chlorine-containing residues may cause corrosion of the underlying metal prior to subsequent downstream processing steps which may include washing (solvent rinse) steps resulting in removal of such chlorine-containing residues.

Since it is know that such subsequent processing steps can result in removal of any chlorine-containing residues remaining in sidewalls from the metal etch step, it has become conventional to judge the effectiveness of the photoresist removal step in also removing or inactivating such chlorine-containing residues based on how much corrosion occurs during a 24 hour period following the photoresist removal step. If no corrosion of the underlying metal occurs within 24 hours after the photoresist removal step, the photoresist removal step is judged to have successfully removed or inactivated a sufficient amount of such corrosion-causing residues, since it is assumed that within 24 hours the integrated circuit structure will have been subjected to subsequent processing which will include at least one subsequent washing step which will remove any remaining chlorine-containing residues.

However, the currently practiced photoresist removal process using $O_2$ and $CF_4$, has not succeeded in providing this desired 24 hours of protection from corrosion of the metal by such chlorine-containing residues.

It would, therefore, be desirable to provide an improved process for the removal of photoresist remaining after a metal etch step which would not only remove the photoresist mask, but also remove or inactivate a sufficient amount of any remaining chlorine-containing residues from the metal etching step so that the remaining metal or metals will be passivated or free from corrosion for at least 24 hours after such processing.

SUMMARY OF THE INVENTION

The invention comprises a process for removing photoresist remaining after a metal etch which also removes or inactivates a sufficient amount of any remaining chlorine-containing residues, in sidewall residues from the metal etch step, to inhibit corrosion of the remaining metal or metals for at least 24 hours. The process includes a first stripping step using either $O_2$ or a combination of and a fluorocarbon gas and/or nitrogen gas, associated with a plasma; and followed by a subsequent step using a combination of $O_2$ and $NH_3$ gases also associated with a plasma. When a fluorocarbon gas is used in the first stripping step, a flushing step may be used prior to introduction of the $NH_3$ gas to flush out any remaining fluorocarbon gas.

BRIEF DESCRIPTION OF THE DRAWING

The sole FIGURE is a flow sheet illustrating the process of the invention.

DETAILED DESCRIPTION OF THE INVENTION

The process of the invention is utilized on an integrated circuit structure whereon a metal layer, or a composite of metal layers, previously deposited on an integrated circuit structure, and which, for example, may comprise a titanium nitride barrier layer and an overlying aluminum layer, has just been etched through a photoresist mask, leaving titanium nitride barrier portions and aluminum portions under the photoresist mask. After the metal etch step, sidewall etch residues remain on the sidewall surfaces of the photoresist mask, and on the sidewall surfaces of the remaining underlying metal layer portions. These sidewall etch residues, in turn, contain chlorine etch materials or residues therein which can cause corrosion of such metal portions.

In accordance with the invention, the chlorine-containing residues in such sidewalls are removed or inactivated and remaining metal portions of the metal layers are passivated during the process for the removal of the photoresist mask portions.

The metal layer or layers, partially removed during the preceding metal etch step to leave the patterned metal portions, may comprise any metal conventionally used in the formation of integrated circuit structures, such as, for example, aluminum, titanium, tungsten, etc. When multiple metal layers are etched to form metal portions, the upper metal portions will usually comprise aluminum and the underlying metal portions will usually comprise a metal compound such as titanium nitride which serves as a barrier layer to prevent spiking of aluminum to underlying silicon contacts. Such underlying electrically conductive metal-containing barrier materials will be referred to herein as metal layers, regardless of whether they comprise pure metals, metal alloys, or metal compounds.

The process of the invention finds greatest utility when the upper metal portions over the barrier layer comprise aluminum or any other metal which may be subject to corrosion by chlorine-containing residues, or other corrosion-forming metal etch step residues, if such residues are not removed during the photoresist removal step. By aluminum is meant either pure aluminum or an aluminum alloy such as, for example, an aluminum alloy containing 1-2 wt. % silicon and 0-4 wt. % copper.

The integrated circuit structure (wafer) is removed from the metal etch chamber and placed in a vacuum stripping chamber, unless the same chamber is to be used for both processes. The stripping chamber is maintained at a pressure ranging from about 0.5 to about 3 Torr, typically about 2 Torr. The temperature of the wafer at this stage is within a range of from about 40° C. to about 100° C.

During the first stripping stage, $O_2$ gas may be used alone or in combination with a fluorocarbon and/or $N_2$ gas. When a fluorocarbon gas is used in this step, the fluorocarbon gas may comprise, for example, $CF_4$, $CHF_3$, $C_2F_6$, $C_3F_6$, $C_2H_4F_2$, or the like. However, the use of $CF_4$ gas is preferred.

The rate of flow of such gas or gases in this first step will be at a rate equivalent to a rate of from about 1000 to about 2000 standard cubic centimeters per minute (sccm), typically about 1400 sccm, of $O_2$; from about 0 to about 150 sccm, typically about 100 sccm, of $N_2$; and from about 0 sccm to about 80 sccm, typically about 45 sccm, of the fluorocarbon gas into a 5 liter stripping chamber.

A plasma having a power level of about 500 watts to about 2500 watts, typically about 1400 watts, is then ignited in the gas flow, preferably upstream of the stripping chamber, and maintained for about 10 seconds after which the plasma is extinguished and the flow of the fluorocarbon gas such as $CF_4$ is shut off. The flow of $N_2$ into the chamber may also optionally be shut off at this time.

While any type of conventionally generated plasma may, in general, be used in the practice of the invention, preferably the plasma used in the process of the invention is generated by a microwave plasma generator such as, for example, a Model AURA plasma generator commercially available from the GaSonic division of Atomel Corporation of Sunnyvale, Calif., which is located upstream of the stripping chamber.

In this type of apparatus, the gas flowing toward the stripping chamber first passes through the microwave plasma generator located upstream of the stripping chamber and the plasma generated therein produces reactive species from the gases flowing through the plasma generator to the stripping chamber, and such reactive species then flow into the stripping chamber.

After the plasma is extinguished, and the flow of fluorocarbon gas into the chamber is shut off, at the end of the first step, the flow of $O_2$ may be increased from 1400 sccm (or its equivalence in a larger or smaller chamber) up to from about 2000 sccm to about 4000 sccm, typically about 3000 sccm, to flush out any remaining fluorocarbon gas prior to the next step of the process. This flushing step, which need only be carried out if fluorocarbons are used in the first step, is carried out for a minimum time period of at least about 10 seconds.

During this flushing step, the temperature of the wafer may be slowly ramped up, at a rate of about 10° C./second, to a temperature of from about 150° C. to about 400° C., typically about 245° C., at which temperature the wafer is maintained during the remainder of the process.

While the wafer is heating up to the desired operating temperature, e.g., 245° C., ammonia gas is flowed through the plasma generator into the stripping chamber at a rate equivalent to from about 10 to about 300 sccm, and typically about 65 sccm, into a 5 liter chamber, while the $O_2$ is flowed through the plasma generator into the stripping chamber at an equivalent rate within the range of from about 2000 to about 5000 sccm, typically about 3000 sccm. The ratio of $NH_3$ gas to $O_2$ gas flowing into the stripping chamber should range from about 0.5 volume % $NH_3$ to about 10 volume % $NH_3$, with the balance $O_2$ gas.

The $O_2$ and $NH_3$ gases are flowed through the plasma generator into the stripping chamber for a period of at least about 10 seconds, after which a plasma is ignited in the plasma generator and maintained for a period of at least about 40 seconds, preferably at least about 60 seconds, during which the flow of the $O_2$ and $NH_3$ gases through the plasma generator into the stripping chamber is maintained. Longer periods of time can be used, both for the gas flow prior to the plasma ignition, as well as the period during which the plasma remains on, but such longer periods are deemed to be unnecessary.

After the plasma is extinguished and the flow of gases shut off, the wafer may be removed from the stripping chamber and subject to further processing, e.g., topside processing, as desired. The process of the invention removes all of the photoresist and also removes or inactivates a sufficient amount of any chlorine-containing residues remaining from prior metal etching to provide freedom from any corrosion for at least 24 hours following the resist removal process of the invention.

To further illustrate the invention, a silicon wafer was provided with a layer of oxide thereon, a layer of aluminum containing 1 wt. % silicon and 0.5 wt. % copper deposited over the oxide layer, and a photoresist mask formed over the metal layer. The metal layer was first conventionally etched through the photoresist mask using a mixture of $BCl_3$ and $Cl_2$ etchant gases in a 11.5 liter vacuum etch chamber.

The wafer was then placed in a 5 liter stripping chamber where the photoresist mask was then stripped and the underlying metal passivated by removal or inactivation of any etch residues remaining from the metal etch step by first flowing a mixture of $O_2$, $CF_4$, and $N_2$ through a microwave plasma generator located upstream of the stripping chamber, and then into the chamber at a rate of 1400 sccm $O_2$, 45 sccm $CF_4$, and 100 sccm $N_2$, for a period of about 10 seconds during which a plasma was ignited in the plasma generator and maintained at a power level of about 1400 watts.

The plasma was then extinguished and the flow of $CF_4$ and $N_2$ shut off, while the flow of $O_2$ was increased to 3000 sccm to flush out any remaining $CF_4$ gases. During this flushing period the wafer was ramped up to a temperature of about 245° C. at a rate of about 10° C. per second, e.g., over about a 25 second period.

After the wafer reached 245° C., as measured by a thermocouple contacting the back of the wafer, $NH_3$ was flowed through the plasma generator into the chamber at a rate of about 65 sccm. After about 10 seconds, the plasma was reignited in the plasma generator and maintained for about 60 seconds following which the flow of $NH_3$ was shut off and the plasma extinguished.

The wafer was then removed from the stripping chamber and allowed to stand in the open atmosphere for 24 hours. The wafer surface was then examined, using 500 × light field and dark field optical microscopes, and a 50,000 × scanning electron microscope (SEM). All of the photoresist was removed and no evidence of corrosion was found on the exposed metal surfaces.

Thus, the process of the invention results in complete removal of photoresist from the surface of an integrated circuit structure after patterning of a metal layer beneath the resist mask and the remaining metal is passivated by removal or inactivation of any corrosion-producing residues remaining from the prior metal etch step.

Having thus described the invention what is claimed is:

1. A process for removing from an integrated circuit structure, in a stripping chamber, photoresist remaining after a metal etch which comprises:
   a) exposing said structure to $O_2$ gas for a period of at least about 10 seconds; and
   b) then exposing said structure to $O_2$ gas and $NH_3$ gas for a period of at least about 40 seconds.

2. The process of claim 1 which further comprises igniting a plasma associated with said stripping chamber during said step b).

3. The process of claim 2 wherein said plasma ignited during said step b) is maintained at a power level of from about 500 to about 2500 watts.

4. The process of claim 3 wherein said plasma is generated in a microwave plasma generator upstream of said stripping chamber.

5. The process of claim 4 wherein said $NH_3$ gas is flowed through said plasma generator into said stripping chamber at a rate equivalent to a flow of from about 10 sccm to about 300 sccm into a 5 liter chamber.

6. The process of claim 4 wherein said $O_2$ gas is flowed through said plasma generator into said stripping chamber during said step b) at a rate equivalent to a flow of from about 2000 sccm to about 5000 sccm into a 5 liter chamber.

7. The process of claim 4 wherein the ratio of $NH_3$ gas to $O_2$ gas flowing through said plasma generator into said stripping chamber during said step b) should range from about 0.5 volume % $NH_3$ to about 10 volume % $NH_3$.

8. The process of claim 7 which further comprises igniting a plasma in said plasma generator during said step a).

9. The process of claim 8 wherein said step a) further comprises exposing said wafer to a combination of $O_2$ gas and $N_2$ gas or a fluorocarbon gas.

10. The process of claim 8 wherein $O_2$, and optionally $N_2$ gas and/or a fluorocarbon gas, is flowed through said plasma generator into said stripping chamber during said step a) at a rate equivalent to flowing from about 1000 sccm to about 2000 sccm of said $O_2$ gas, from 0 sccm to about 150 sccm of said $N_2$ gas, and from 0 sccm to about 80 sccm of said and from 0 sccm to about 80 sccm of said fluorocarbon gas into a 5 liter chamber.

11. The process of claim 8 wherein said plasma during said step a) is maintained at a power level of from about 500 to about 2500 watts.

12. The process of claim 10 wherein a fluorocarbon gas flows through said plasma generator into said stripping chamber during said step a) and which includes the additional step of continuing to flow $O_2$ through said plasma generator into said stripping chamber after extinguishing said plasma and shutting off the flow of said fluorocarbon gas into said chamber during said step a) to thereby purge said stripping chamber of any fluorocarbon gas in said stripping chamber prior to commencement of step b).

13. The process of claim 1 wherein said wafer is maintained at a temperature of from about 100° C. to about 400° C. during said step b).

14. The process of claim 13 wherein said wafer is maintained at from about 40° C. to about 100° C. during said step a) and then heated to said step b) temperature range at a rate of about 10° C. per second.

15. The process of claim 1 wherein said stripping chamber is maintained at a pressure of from about 0.5 Torr to about 3 Torr during said process.

16. A process for removing, from an integrated circuit structure, photoresist remaining after a metal etch which comprises:
   a) flowing through a microwave plasma generator into a stripping chamber containing said integrated circuit structure a mixture of $O_2$, $N_2$, and fluorocarbon gases for a period of at least about 10 seconds at a rate equivalent to flowing from about 1000 sccm to about 2000 sccm of said $O_2$ gas, from about 50 sccm to about 150 sccm of said $N_2$ gas, and from about 20 sccm to about 80 sccm of said fluorocarbon gas into a 5 liter chamber;
   b) igniting a plasma in said plasma generator while said $O_2$, $N_2$, and fluorocarbon gases are flowing through said plasma generator into said stripping chamber;
   c) then extinguishing said plasma and shutting off said flow of said $N_2$ gas and said fluorocarbon gas into said stripping chamber while maintaining said flow of $O_2$ into said chamber to purge said chamber of fluorocarbon gas;
   d) then flowing $NH_3$ and $O_2$ gases through said plasma generator into said stripping chamber at a rate equivalent to a flow of from about 10 sccm to about 300 sccm of $NH_3$ and from about 2000 sccm to about 5000 sccm of $O_2$ into a 5 liter chamber; and
   e) igniting a plasma in said plasma generator at least about 10 seconds after said $NH_3$ and $O_2$ gases begin flowing through said plasma generator into said stripping chamber.

17. The process of claim 16 wherein said hydrocarbon gas comprises $CF_4$.

18. The process of claim 16 wherein said plasma is maintained at a power level of from about 500 watts to about 2500 watts while said $O_2$, $N_2$, and $CF_4$ gases are flowing through said plasma generator into said stripping chamber.

19. The process of claim 16 wherein said plasma is maintained at a power level of from about 500 watts to about 2500 watts for a period of at least about seconds while said $O_2$ and $NH_3$ gases are flowing through said plasma generator into said stripping chamber.

20. A process for removing, from an integrated circuit structure, photoresist remaining after a metal etch, which process also removes or inactivates chlorine residues remaining from said previous metal etch, comprising:

a) flowing through a microwave plasma generator into a stripping chamber containing said integrated circuit structure a mixture of $O_2$, $N_2$, and $CF_4$ gases for a period of at least about 10 seconds at a rate equivalent to flowing from about 1000 sccm to about 2000 sccm of said $O_2$ gas, from about 50 sccm to about 150 sccm of said $N_2$ gas, and from about 20 sccm to about 80 sccm of said $CF_4$ gas into a 5 liter chamber;

b) igniting a plasma in said microwave plasma generator and maintaining said plasma in said generator at a power level of from about 500 watts to about 2500 watts while said $O_2$, $N_2$, and $CF_4$ gases are flowing through said plasma generator into said stripping chamber;

c) then extinguishing said plasma and shutting off said flow of said $N_2$ gas and said $Cf_4$ gas into said stripping chamber while maintaining said flow of $O_2$ into said chamber to purge said stripping chamber of said $CF_4$ gas;

d) then flowing $NH_3$ and $O_2$ gases into said through said plasma generator into said stripping chamber at a rate equivalent to a flow of from about 10 sccm to about 300 sccm of $NH_3$ and from about 2000 sccm to about 5000 sccm of $O_2$ into a 5 liter chamber; and e) igniting a plasma in said microwave plasma generator at least about 10 seconds after said $NH_3$ and $O_2$ gases begin flowing through said generator into said stripping chamber and maintaining said plasma at a power level of from about 500 watts to about 2500 watts for a period of at least about 40 seconds.

* * * * *